(12) United States Patent
Gomis Bellmunt et al.

(10) Patent No.: US 9,124,134 B2
(45) Date of Patent: Sep. 1, 2015

(54) METHOD FOR AVOIDING VOLTAGE INSTABILITY IN AN ELECTRICAL GRID OF AN OFFSHORE WIND PARK

(71) Applicant: ALSTOM RENEWABLE TECHNOLOGIES, Grenoble (FR)

(72) Inventors: Oriol Gomis Bellmunt, Barcelona (ES); Mónica Aragüés Peññalba, Barcelona (ES)

(73) Assignee: ALSTOM RENEWABLE TECHNOLOGIES, Grenoble (FR)

( * ) Notice: Subject to any disclaimer, the term of this patent is extended or adjusted under 35 U.S.C. 154(b) by 0 days.

(21) Appl. No.: 14/375,771

(22) PCT Filed: Feb. 14, 2013

(86) PCT No.: PCT/EP2013/053029
§ 371 (c)(1),
(2) Date: Jul. 30, 2014

(87) PCT Pub. No.: WO2013/120976
PCT Pub. Date: Aug. 22, 2013

(65) Prior Publication Data
US 2015/0042093 A1      Feb. 12, 2015

Related U.S. Application Data

(60) Provisional application No. 61/624,884, filed on Apr. 16, 2012.

(30) Foreign Application Priority Data

Feb. 16, 2012    (EP) ..................................... 12382051

(51) Int. Cl.
*H02J 3/24*      (2006.01)
*F03D 7/04*      (2006.01)
(Continued)

(52) U.S. Cl.
CPC ... *H02J 3/24* (2013.01); *F03D 7/00* (2013.01); *F03D 7/0284* (2013.01); *F03D 7/048* (2013.01);
(Continued)

(58) Field of Classification Search
CPC .......... H02J 3/24; H02J 3/386; Y02E 60/728; Y02E 40/30; Y02E 10/563; Y02E 40/34; Y04S 10/522; Y04S 10/54; G01R 19/2513; G01R 29/18; H02H 3/28; F03D 9/005; H02P 9/105
USPC ...................... 702/57, 58, 59, 60, 64, 65, 106; 700/286, 291, 295, 297, 298, 299, 300; 307/31, 638, 39, 64, 66; 290/44; 324/522, 525
See application file for complete search history.

(56) References Cited

U.S. PATENT DOCUMENTS

| | | | |
|---|---|---|---|
| 5,642,000 A * | 6/1997 | Jean-Jumeau et al. .......... | 307/31 |
| 6,738,719 B2 * | 5/2004 | Stoupis et al. .................. | 702/58 |

(Continued)

FOREIGN PATENT DOCUMENTS

DE       10 2004048341       4/2006

OTHER PUBLICATIONS

International Search Report and Written Opinion for PCT/EP/2013/053029, mailed Jun. 5, 2013, 10 pgs.

(Continued)

*Primary Examiner* — Darrin Dunn
(74) *Attorney, Agent, or Firm* — Squire Patton Boggs (US) LLP

(57) ABSTRACT

Method for avoiding voltage instability in an electrical grid of an offshore wind park, the offshore wind park electrical grid being connected at a first end of a high voltage alternating current (HVAC) transmission and the main land electrical grid being connected at a second end of the HVAC transmission, each of the wind turbines being connected to the wind park electrical grid, the method comprises determining a main land phase angle at or near the second end of the HVAC transmission; measuring an individual wind turbine phase angle at one or more wind turbines; determining the difference between each of the measured individual wind turbine phase angles and the main land phase angle; and determining whether the difference between one of the measured individual wind turbine phase angle and the main land phase angle exceeds a threshold phase angle difference.

14 Claims, 1 Drawing Sheet

(51) Int. Cl.
*F03D 9/00* (2006.01)
*H02J 3/38* (2006.01)
*F03D 7/02* (2006.01)
*F03D 7/00* (2006.01)

(52) U.S. Cl.
CPC .............. *F03D 9/005* (2013.01); *H02J 3/386* (2013.01); *F05B 2240/95* (2013.01); *Y02E 10/723* (2013.01); *Y02E 10/763* (2013.01)

(56) References Cited

U.S. PATENT DOCUMENTS

| | | | |
|---|---|---|---|
| 7,498,821 B2* | 3/2009 | Wells | 324/521 |
| 7,603,203 B2* | 10/2009 | Zhang et al. | 700/295 |
| 8,340,931 B2* | 12/2012 | Dickens | 702/60 |
| 8,378,515 B2* | 2/2013 | Fortmann | 290/44 |
| 8,942,856 B2* | 1/2015 | Ren et al. | 700/297 |
| 2002/0149375 A1* | 10/2002 | Hu et al. | 324/522 |
| 2003/0081364 A1* | 5/2003 | Stoupis et al. | 361/62 |
| 2004/0010350 A1* | 1/2004 | Lof et al. | 700/292 |
| 2007/0096747 A1* | 5/2007 | Wells | 324/520 |
| 2008/0073912 A1 | 3/2008 | Fortmann et al. | |
| 2011/0022240 A1* | 1/2011 | Rajapaske | 700/287 |
| 2011/0082654 A1* | 4/2011 | Dickens | 702/60 |
| 2012/0086459 A1* | 4/2012 | Kim | 324/522 |
| 2012/0112713 A1* | 5/2012 | Kuehn | 323/207 |
| 2012/0181879 A1* | 7/2012 | Andresen et al. | 307/151 |
| 2012/0280569 A1* | 11/2012 | Alam et al. | 307/60 |
| 2013/0043690 A1* | 2/2013 | Wilson et al. | 290/40 B |
| 2013/0140903 A1* | 6/2013 | Divan et al. | 307/82 |
| 2013/0265030 A1* | 10/2013 | Kuroda et al. | 323/318 |
| 2015/0042093 A1* | 2/2015 | Gomis Bellmunt et al. | 290/44 |

OTHER PUBLICATIONS

Augustí Egea-Alvarez et al., "Active and Reactive Power Control of Grid Connected Distributed Generation Systems", Modeling and Control of Sustainable Power Systems, Green Energy and Technology, pp. 47-81 (2012), Jan. 1, 2012.

Glavic et al., "A short Survey of Methods for Voltage Instability Detection", Power and Energy Society General Meeting IEEE, 8 pgs. (2011), Jul. 24-29, 2011.

Nizam et al. "Performance Evaluation of Voltage Stability Indices for Dynamic Voltage Collapse Prediction", J. of Applied Science 6 (5) pp. 1104-1113 (2006), May 2006.

* cited by examiner

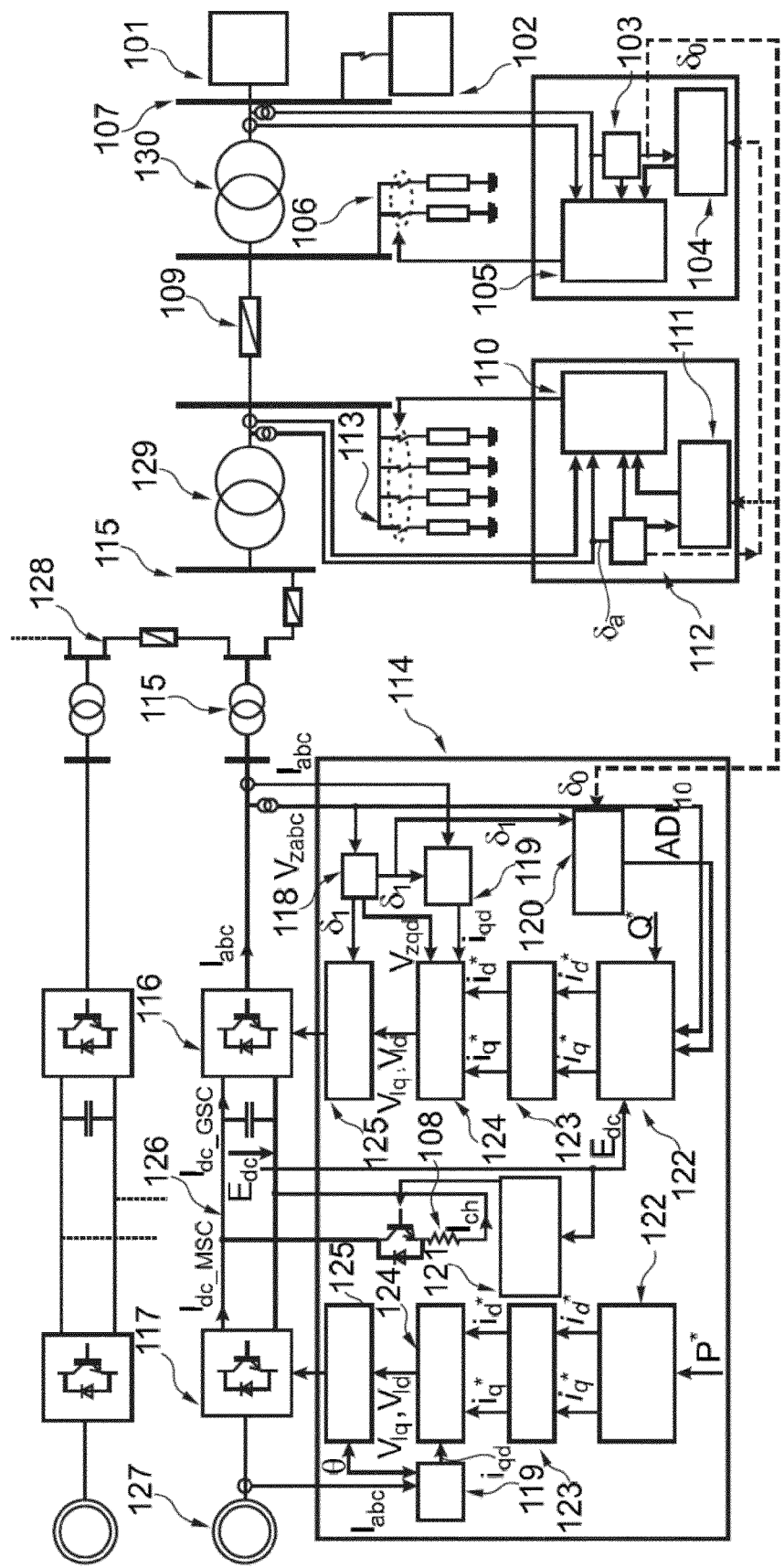

METHOD FOR AVOIDING VOLTAGE INSTABILITY IN AN ELECTRICAL GRID OF AN OFFSHORE WIND PARK

This application claims the benefit of European Patent Application EP12382051, filed on Feb. 16, 2012, and of U.S. Provisional Patent Application Ser. No. 61/624,884, filed on Apr. 16, 2012.

The present invention relates to methods for avoiding voltage instability in offshore wind parks

BACKGROUND ART

Modern wind turbines are commonly used to supply electricity into the electrical grid. Wind turbines of this kind generally comprise a rotor with a rotor hub and a plurality of blades. The rotor is set into rotation under the influence of the wind on the blades. The rotation of the rotor shaft either directly drives the generator rotor ("directly driven") or through the use of a gearbox.

An important trend in the field of wind turbines is to place the turbines in offshore wind parks. These wind parks comprise a plurality of wind turbines and a local wind park grid. This wind park grid may be connected to an onshore electrical grid through a High Voltage Alternating Current (HVAC) transmission.

In known HVAC transmission systems voltage instability problems may occur which may cause a voltage collapse in case of severe disturbances, like deep voltage sags. Voltage stability may be defined as the ability of a power system to maintain steady acceptable voltages at all buses in the system under normal operating conditions and after being subjected to a disturbance.

A system may enter a state of voltage instability when a disturbance, an increase in load demand, or a change in system conditions, cause a progressive and uncontrollable drop in voltage. An important factor causing instability is the inability of the power system to meet the demand for reactive power. At the heart of the problem is usually the voltage drop that occurs when active and reactive power flow through inductive reactances associated with the transmission network.

Voltage instability is a local phenomenon; however, its consequences may have a widespread impact. Voltage Collapse is more complex than simple voltage instability and is usually the result of a sequence of events accompanying voltage instability leading to a low-voltage profile in a significant part of the power system. Solutions that only take into account local voltages may not be good enough to predict and/or prevent voltage collapse for electrical grids involving offshore wind parks.

The prediction of voltage instabilities with enough anticipation in order to avoid damaging consequences is fundamental. In this respect, it is known to use a Voltage Collapse Prediction Index (VCPI) consisting of calculating this index at every bus of the power system in offshore wind parks. The calculation of this VCPI requires to have voltage phasor information of the buses in the system and to know the network admittance matrix. The value of VCPI may determine the proximity to voltage collapse at a specific bus. A disadvantage is that the index used is rather complex and the information necessary to use it may not even be available to wind park operators.

In this respect, a simpler index that is able to assist in avoiding voltage collapse is desired.

SUMMARY OF THE INVENTION

In a first aspect, the invention provides a method for avoiding voltage instability in an electrical grid of an offshore wind park, wherein the offshore wind park electrical grid is connected at a first end of a high voltage alternating current transmission and the main land electrical grid is connected at a second end of the high voltage alternating current transmission, and wherein the wind park has a plurality of wind turbines. The method comprises determining a main land phase angle at or near the second end of the high voltage alternating current transmission and measuring an individual wind turbine phase angle at one or more wind turbines. The method further comprises determining a threshold phase angle difference, determining the difference between each of the measured individual wind turbine phase angles and the main land phase angle and determining whether the difference between one of the measured individual wind turbine phase angle and the main land phase angle exceeds the threshold phase angle difference.

It has been found that the difference between the phase angle at an individual wind turbine and the phase angle at the onshore end of the HVAC may be used to indicate when a situation close to voltage instability (and voltage collapse) arises. Whenever this phase angle difference surpasses a threshold value, a warning may be obtained and/or preventive actions may be undertaken. An advantage of using this phase angle difference is that it is relatively simple and easy to implement. A further advantage is that it has been found to be reliable for avoiding voltage instability.

In some embodiments, determining the main land phase angle comprises measuring a phase angle at or near the first end of the high voltage alternating current transmission and calculating the main land phase angle at the second end based on a model of the high voltage alternating current transmission. Alternatively, the phase angle may be measured at the second end of the HVAC transmission. This information may then be sent through a suitable communications network (e.g. optical fiber) to the offshore wind park.

In an implementation, wherein there is no such communication system between the offshore wind park electrical grid and the main land electrical grid, the main land phase angle may be computed at the first end of the high voltage alternating current transmission. In order to achieve this, a phase angle may be measured at or near the first end of the high voltage alternating current transmission. Next the main land phase angle may be estimated based on the measured phase angle at the first end of the HVAC and on the model of the HVAC transmission system. This model may comprise the electrical parameters of HVAC transmission line. These parameters may permit to calculate the phasor of the voltage at the main land electrical grid. The main land phase angle may be obtained from this phasor.

In some embodiments, if a difference between at least one individual wind turbine phase angle and the main land phase angle exceeds the threshold phase angle, the active power generated by all the wind turbines of the wind park is reduced. A relatively high value of the phase angle difference may indicate that the HVAC is close to its limits, so that in as far as possible, the active power generated by the wind turbines is reduced without completely disconnecting the turbines.

In some embodiments, if a difference between at least one individual wind turbine phase angle and the main land phase angle exceeds the threshold phase angle, the reactive power provided by one or more of the wind turbines is adjusted.

In some embodiments, one or more AC reactors may be provided at or near the first end and/or at or near the second end of the high voltage alternating current transmission for optimizing the power flow across the HVAC. In these embodiments, the AC reactors may be disconnected if a difference between the first angle at or near the first end and the main land phase angle exceeds the threshold phase angle.

The AC reactors located at or near the first end and/or at or near the second end of the high voltage alternating current transmission may consume reactive power to compensate the capacitive reactive power from the cables. Therefore, if a difference between the first angle at or near the first end and the main land phase angle exceeds the threshold phase angle, it may be suitable to disconnect these reactors in order to avoid larger reactive power consumption in the power system.

Additional objects, advantages and features of embodiments of the invention will become apparent to those skilled in the art upon examination of the description, or may be learned by practice of the invention.

BRIEF DESCRIPTION OF THE DRAWINGS

Particular embodiments of the present invention will be described in the following by way of non-limiting examples, with reference to the appended drawings, in which:

FIG. 1 illustrates a general control scheme according to an embodiment of the present invention;

DETAILED DESCRIPTION OF EMBODIMENTS

FIG. 1 shows a schematic representation of a general control scheme of a power system according to an embodiment of the present invention. FIG. 1 shows an offshore wind park comprising a generating unit or wind turbine 127, which in this embodiment may be a permanent magnet synchronous machine (PMSM). The generator of the wind turbine may be connected to a Back-to-Back converter comprising two voltage source converters: machine side converter 117 (MSC) and grid side converter 116 (GSC), and a DC link 126. Further shown is a control unit 114 which controls the wind turbine 127. The already-mentioned elements are connected to a medium voltage transformer 115 and a medium voltage transmission line 128.

A point of common coupling (PCC) of the offshore wind park 115 connects the offshore wind park with the first end of a high voltage alternating current (HVAC) transmission 109 which comprises a high voltage transformer 129 and AC reactors 113. The AC reactors 113 may be controlled by the AC compensations disconnection control unit 110. A point of common coupling (PCC) onshore 107 connects the second end of the HVAC transmission 109 which comprises a high voltage transformer 130 and AC reactors 106 to an onshore electrical grid 101 and a STATCOM 102 or a similar regulating device, such as e.g. a Static Var Compensator (SVC). The AC reactors 106 may be controlled by the AC compensations disconnection control unit 105. The AC reactors and STATCOM generally may have the role of optimizing the power flow through the HVAC as well as providing the referenced reactive power to the grid according to the applicable grid code.

The prediction of voltage instability before it happens and in response, performing some actions to avoid the mentioned voltage instability, which could lead to a voltage collapse, is highly desirable. Prediction of voltage instability is meant to be understood as the capacity for determining that voltage instability may occur in a short period of time but it has not happened yet. It has been found that, in order to predict voltage instability the difference in voltage angle between the onshore end of the HVAC and buses in the wind park is a reliable indicator. This difference is determined in accordance with:

$$\delta = |\delta_i - \delta_j|$$

Wherein $\delta_i$ is the angle of the voltage phasor at bus i, $\delta_j$ is the angle of the voltage phasor at bus j.

In the current embodiment, an index that is based on the difference in voltage angles is proposed. This index may be called ADI (Angular Difference Index) and may be determined in accordance with the following equation:

$$ADI_{ij} = \frac{|\delta_i - \delta_j|}{\delta_{lim}}$$

Wherein $\delta_{lim}$ is the angle that determines maximum active power transmission (90°, theoretically). The value of ADI may vary between 0 and 1 and it may predict the proximity to voltage collapse at a specific bus. If $ADI_{ij}=0$, the voltage at a specific bus i is considered stable and if $ADI_{ij}=1$ a voltage collapse may occur.

Thus, based on ADI, when $\delta=|\delta_i-\delta_j|$ reaches the theoretic limit of 90°, the maximum active power deliverable is achieved, $ADI_{ij}=1$ and voltage collapse may occur. But, in fact, in accordance with circumstances, the limit may be set at a different level. For example, a critical angular difference $\delta_{critical}$ (e.g. 83°) may be defined. In this respect, if $\delta=|\delta_i-\delta_j|\geq\delta_{critical}$ voltage instability is predicted.

Based on the above, when voltage instability is predicted ($|\delta_i-\delta_j|\geq\delta_{critical}$) some actions to avoid the mentioned voltage instability which could lead in a voltage collapse may be performed as shown below:

Control Implemented in the Voltage Source Converters of the Back-to-Back Converter Once Voltage Instability is Predicted:

Once voltage instability is predicted, one suitable response may be to reduce the active power delivered by the generating unit or wind turbine 127 and to adequate the reactive power injection. In this respect, when voltage instability is predicted, the wind turbine 127 may keep generating power during the disturbances associated to the voltage instability state. In this embodiment, a DC chopper 108 is provided. Both the DC chopper 108 and the voltage source converters: machine side converter 117 and grid side converter 116 of a Back-to-Back converter connected to the wind turbine 127 may be used to regulate the active and reactive power.

The prediction of voltage instability at wind turbine 127 is based on the aforementioned index ADI. The ADI particularized for the wind turbine 127 may be called $ADI_{k0}$ and may be determined in accordance with the following equation:

$$ADI_{k0} = \frac{|\delta_k - \delta_0|}{\delta_{lim}}$$

Wherein $\delta_k$ is the angle of the voltage phasor at the bus where the wind turbine k (for this embodiment, wind turbine 127) may be connected. The angle $\delta_k$ may be calculated with the Phase Lock Loop (PLL) 118. The angle $\delta_0$ may be calculated with the PLL unit 103 at or near the second end of the high voltage alternating current transmission 109 generally measured at the point of common coupling (PCC) 107. The angle $\delta_{lim}$ is the angle when maximum active power is transmitted and may be set at the theoretical maximum of 90°, but may also be set at a different, more conservative level. It will be clear that the index may be calculated for a plurality or all of the wind turbines in a wind park.

A critical angular difference $\delta_{critical}$ (e.g. approximately 60°, 70° or 80°) may be defined and if $\delta=|\delta_k-\delta_0|\geq\delta_{critical}$, then voltage instability is predicted and several actions to avoid voltage instability are performed.

The box 114 of FIG. 1 delimits the control unit which controls the wind turbine 127.

Once the voltage instability is predicted ($|\delta_k-\delta_0| \geq \delta_{critical}$), another action that may be carried out is the computation of the definite references currents $I_q*$ and $I_d*$ to be applied in the wind turbine 127. To obtain these reference currents, reference active power P* and reference reactive power Q* may be computed in accordance with:

$$P* = P_{ref} \cdot alpha\_P$$

$$Q* = Q_{ref} \cdot alpha\_P$$

Wherein P* is the desired active power, Q* is the desired reactive power, $P_{ref}$ and $Q_{ref}$ are the references of active power P and reactive power Q in a normal condition respectively, alpha_P and alpha_Q is a reduction parameter that may be computed as follows:

if $ADI_{k0} < ADI_{k0\_0}$ and $V > Vsag \rightarrow alpha\_P=1, alpha\_Q=1$ if $ADI_{k0} \geq ADI_{k0\_0}$ or $V \leq Vsag \rightarrow alpha\_P = \max(0, k1p \cdot (1-ADI_{k0}) + k2p \cdot (1-V))$ $$alpha\_Q = \max(0, k1q \cdot (1-ADI_{k0}) + k2q \cdot (1-V))$$

Wherein $ADI_{k0}$ is the stability index at wind turbine k (for this embodiment, wind turbine 127), $ADI_{k0\_0}$ is an adjustable parameter (0.2-0.4), V is the local voltage in the generating machine (p.u.), Vsag is an adjustable parameter (p.u.) indicative of the maximum acceptable voltage sag and k1p, k2p, k1q and k2q are adjustable weights. Based on the above, it must be noted that verifying that the local voltage V is lower than a predetermined value Vsag may be an additional verification which may predict voltage instability or other problems in the electrical grid.

When $ADI_{k0} \geq ADI_{k0\_0}$ or $V \leq Vsag$, alpha_P and alpha_Q takes the maximum value among 0 and $k1q \cdot (1-ADI_{k0}) + k2q \cdot (1-V)$ to avoid negative values. In this embodiment, the local voltage is thus also taken into account. In other implementation, this does not necessarily need to be the case.

Once the desired active and reactive power P* and Q* are obtained, the definite references currents $I_q*$ and $I_d*$ may be computed in the reference current computation units 122. The voltages of the AC side of the converters 117 and 116 in reference qd called Vlq, Vld may then be obtained from calculus derived from currents $I_q*$ and $I_d*$ effectuated in reference current limitation modules 123, current loops modules 124, Park modules 119 and SVM modules 125. Once the voltages Vlq, Vld have been obtained, they may be applied to the voltage source converters 117 and 116 within the Back-to-Back converter in order to control the reactive power and the torque of the wind turbine 127 with the voltage source converter 117 and to control the voltage in the DC link 126, and to generate or consume reactive power with the voltage source converter 116.

Control Performed by the DC Chopper Once Voltage Instability is Predicted:

In order to help to achieve power reduction, the DC chopper 108 of the generating machine whose bus is close to voltage instability may be activated. The current through the resistance of the DC chopper 108 will correspond to the overvoltage of the DC bus connecting the voltage source converters 117 and 116 in accordance with.

$$I_{ch} = k \frac{E_{dc} - E_{min}}{E_{max} - E_{min}} \longleftrightarrow E_{dc} \geq E_{min}$$

Wherein $I_{ch}$ is the current through the chopper 108, $E_{dc}$ is the voltage of the DC bus of the Back-to-Back converter, and $E_{max}$ and $E_{min}$ are the maximum and minimum values for the actuation of the chopper 108. In case where voltage instability is predicted ($|\delta_k-\delta_0| \geq \delta_{critical}$), $E_{dc}$ may exceed the value $E_{min}$ and if this situation arises, the chopper may be activated by acting on the chopper transistor so that current $I_{ch}$ may be applied to the chopper resistance in order to contribute to reduce active power injection into the grid.

Possible Additional Control Implemented by the AC Compensations Disconnection Control Units Once Voltage Instability is Predicted:

AC reactors 113, 106 may be installed at the first and second end of the high voltage alternating current transmission 109 respectively and they may be controlled by the AC compensations disconnection control units 110, 105, respectively.

In response to the prediction of a voltage instability, a further possible action is the simultaneous disconnection of the AC reactors 113, 106 by the control units 110, 105 in order to avoid larger reactive power consumption. The power system must find out when it is required to disconnect the AC reactors 113, 106 in order to avoid a possible voltage instability state. In this respect, voltage instability must be predicted. The prediction may be based on the verification of the ADI index. In this case, the ADI may be determined individually for the AC reactors; $ADI_{\alpha 0}$ may be determined in accordance with the following equation:

$$ADI_{\alpha 0} = \frac{|\delta_\alpha - \delta_0|}{\delta_{lim}}$$

Wherein $\delta_\alpha$ may be calculated with the PLL unit 112 at or near the first end of the high voltage alternating current transmission 109 and it may be the angle of the voltage phasor at the bus where the offshore wind park AC compensations are connected. The angle $\delta_0$ may be calculated with the PLL unit 103 at or near the second end of the high voltage alternating current transmission 109 generally measured at the point of common coupling (PCC) 107. The angle $\delta_{lim}$ is the angle that permits maximum active power transmission.

The value of $ADI_{\alpha 0}$ varies between 0 and 1 and it determines the proximity to voltage collapse at a specific bus. If $ADI_{\alpha 0}=0$, the voltage at a specific bus a is considered stable and if $ADI_{\alpha 0}=1$ a voltage collapse may occur. The verification required to predict voltage instability in the power system and in response, disconnecting the AC reactors (113, 106) to avoid a larger reactive power consumption is based on determining when the difference between $\delta_\alpha$ and $\delta_0$ called $\delta$ exceeds a threshold phase angle $\delta_{critical}$. In this respect, when $\delta = |\delta_\alpha - \delta_0|$ reaches the theoretic limit of 90°, the maximum active power deliverable is achieved. As it was mentioned before, there is no need to wait for this difference to reach 90° to predict voltage instability. Thus, a critical angular difference $\delta_{critical}$ may be defined and in the case where $\delta = |\delta_\alpha - \delta_0| \geq \delta_{critical}$, then voltage instability is predicted. The ADI index may be calculated at different points of the power system being $\delta$ the general notation for the difference of the angles measured or estimated before and after the high voltage alternating current transmission 109.

Thus, based on the above; one of the actions that may be performed once voltage instability is predicted ($|\delta_\alpha -$ $\delta_0 | \geq \delta_{critical}$) is disconnecting the AC reactors (113, 106) in order to avoid larger reactive power consumption.

In some embodiments, a second verification is carried out in order to predict voltage instability and determine when the AC reactors (113, 106) may be disconnected. This verification is based on determining the voltage V of the bus where the AC compensations are connected; this verification is calculated in accordance with:

$$V \leq V_{sag1}$$

Wherein $V_{sag1}$ is an adjustable parameter based on the specifications of the power system and if $V \leq V_{sag1}$ voltage instability is predicted.

As long as the AC reactors have been disconnected, the STATCOM 102 onshore may be performing in accordance with the grid code of the electrical grid 101.

A further advantage offered by the present invention is that the difference in voltage angles may also be used to determine when the danger of instability has effectively disappeared. E.g. using the aforementioned index ADI for each of the buses in the system, it may be determined that the active power of the wind turbine may be increased again and/or that the DC chopper may be disconnected and/or that the AC reactors may be connected again.

Although only a number of particular embodiments and examples of the invention have been disclosed herein, it will be understood by those skilled in the art that other alternative embodiments and/or uses of the invention and obvious modifications and equivalents thereof are possible. Furthermore, the present invention covers all possible combinations of the particular embodiments described. Thus, the scope of the present invention should not be limited by particular embodiments, but should be determined only by a fair reading of the claims that follow.

The invention claimed is:

1. A method for avoiding voltage instability in an electrical grid of an offshore wind park, the offshore wind park electrical grid being connected at a first end of a high voltage alternating current transmission and a main land electrical grid being connected at a second end of the high voltage alternating current transmission, and the offshore wind park having a plurality of wind turbines connected to the wind park electrical grid, the method comprising:

determining a main land phase angle at or near the second end of the high voltage alternating current transmission, measuring an individual wind turbine phase angle at one or more of the wind turbines, determining a difference between each of the one or more measured individual wind turbine phase angles and the main land phase angle, determining a threshold phase angle difference, and predicting voltage instability when at least one of the differences between the measured individual wind turbine phase angles and the main land phase angle exceeds the threshold phase angle difference, wherein if the difference between at least one individual wind turbine phase angle and the main land chase angle exceeds the threshold chase angle difference, the active and reactive power to be generated by each of the wind turbines is determined based on the corresponding difference between the individual wind turbine phase angle and the main land phase angle.

2. The method according to claim 1, wherein the individual wind turbine phase angle is measured at each of the wind turbines.

3. The method according to claim 1, wherein determining the main land phase angle comprises measuring the main land phase angle at or near the second end of the high voltage alternating current transmission.

4. The method according to claim 1, wherein determining the main land phase angle comprises measuring a phase angle at or near the first end of the high voltage alternating current transmission and calculating the main land phase angle at the second end based on a model of the high voltage alternating current transmission.

5. The method according to claim 1, wherein if a difference between the main land phase angle and an individual wind turbine phase angle exceeds the threshold phase angle, active power generated by the corresponding wind turbine is reduced.

6. The method according to claim 5, wherein if a difference between at least one individual wind turbine phase angle and the main land phase angle exceeds the threshold phase angle, the active power generated by all the wind turbines of the wind park is reduced.

7. The method according to claim 5, wherein the reduction of the active power generated by the corresponding wind turbine involves the use of a DC chopper.

8. The method according to claim 1, wherein the active and reactive power to be generated by each of the wind turbines is also determined based on the threshold phase angle difference.

9. The method according to claim 1, wherein the active and reactive power to be generated by each of the wind turbines is also determined based on the local voltage at each of the wind turbines.

10. The method according to claim 1, wherein one or more AC reactors are provided at or near the first end and/or at or near the second end of the high voltage alternating current transmission, and wherein the method comprises disconnecting the one or more AC reactors if the difference between the at least one individual wind turbine phase angle and the main land phase angle exceeds the threshold phase angle.

11. The method according to claim 1, wherein the wind turbines have permanent magnet synchronous generators.

12. The method according to claim 1, wherein each of the wind turbines is separately connected to a medium voltage line through a medium voltage transformer.

13. The method according to claim 1, wherein the threshold phase angle difference is more than 60°.

14. The method according to claim 13, wherein the threshold phase angle difference is approximately 80°.

* * * * *